United States Patent
Lin et al.

(10) Patent No.: US 9,870,826 B2
(45) Date of Patent: Jan. 16, 2018

(54) MEMORY APPARATUS AND DATA ACCESS METHOD THEREOF BY USING MULTIPLE MEMORIES FOR LIFETIME EXTENSION

(71) Applicant: Nuvoton Technology Corporation, Hsinchu (TW)

(72) Inventors: Chang-Hong Lin, Hsinchu (TW); Chun-Hao Huang, Hsinchu (TW); Chieh-Sheng Tu, Hsinchu (TW)

(73) Assignee: Nuvoton Technology Corporation, Hsinchu (TW)

( * ) Notice: Subject to any disclaimer, the term of this patent is extended or adjusted under 35 U.S.C. 154(b) by 0 days.

(21) Appl. No.: 15/152,581

(22) Filed: May 12, 2016

(65) Prior Publication Data
US 2017/0229182 A1    Aug. 10, 2017

(30) Foreign Application Priority Data
Feb. 5, 2016 (TW) .............................. 105104069 A (51) Int. Cl.
G11C 16/10 (2006.01)
G11C 16/26 (2006.01)
(52) U.S. Cl.
CPC .............. *G11C 16/10* (2013.01); *G11C 16/26* (2013.01)

(58) Field of Classification Search
CPC ................................. G11C 16/10; G11C 16/26
See application file for complete search history.

(56) References Cited

U.S. PATENT DOCUMENTS

| | | | | |
|---|---|---|---|---|
| 7,292,487 B1* | 11/2007 | Gatzemeier | .......... | G11C 29/021 365/201 |
| 2012/0155171 A1* | 6/2012 | Komine | .................. | G11O 5/143 365/185.08 |
| 2016/0027481 A1* | 1/2016 | Hong | ....................... | G11C 7/00 714/807 |

* cited by examiner

*Primary Examiner* — Thao H Bui
*Assistant Examiner* — Alfredo Bermudez Lozada
(74) *Attorney, Agent, or Firm* — JCIPRNET (57) ABSTRACT

A memory apparatus and a data access method thereof are provided. The memory apparatus includes a first memory unit and a second memory unit, wherein an access speed of the second memory unit is higher than an access speed of the first memory unit. The method includes: receiving write data and a corresponding write address; comparing the write data with data corresponding to the write address in the second memory unit, so as to determine whether to write the write data into a current physical memory page of the first memory unit and into the second memory unit; after a data writing operation is executed, executing a data arranging operation on the current physical memory page according to the data in the second memory unit when the current physical memory page is full; and when a read command is received, reading the corresponding data in the second memory unit.

6 Claims, 4 Drawing Sheets

MEMORY APPARATUS AND DATA ACCESS METHOD THEREOF BY USING MULTIPLE MEMORIES FOR LIFETIME EXTENSION

CROSS-REFERENCE TO RELATED APPLICATION

This application claims the priority benefit of Taiwan application Ser. No. 105104069, filed on Feb. 5, 2016 The entirety of the above-mentioned patent application is hereby incorporated by reference herein and made a part of this specification.

BACKGROUND OF THE INVENTION

Field of the Invention

The present disclosure relates to data access technology and particularly relates to a memory apparatus and a data access method thereof that achieve both reliability and high read/write speed.

Description of Related Art

An electrically erasable programmable read only memory (EEPROM) is capable of reading/writing data by bytes and has endurance up to a million times of erase cycles. Because of the characteristics of high read/write speed and high reliability, EEPROM is widely used in embedded systems, storage systems, and so on.

For single-chip products, currently flash memories are used instead of built-in EEPROM to provide the data storage function. However, the endurance of the general flash memories is about twenty thousand times, which is far less than that of EEPROM. Thus, data retention is limited.

SUMMARY OF THE INVENTION

The present disclosure provides a memory apparatus and a data access method thereof that achieve favorable data retention and a high read speed.

The present disclosure provides a data access method of a memory apparatus. The memory apparatus includes a first memory unit and a second memory unit. The first memory unit includes a plurality of physical memory pages, and a data access speed of the second memory unit is higher than a data access speed of the first memory unit. The data access method includes the following steps. Write data is received. The write data corresponds to a write address. The write data is compared with first data corresponding to the write address in the second memory unit to generate a comparison result and whether to execute a data writing operation is determined according to the comparison result. The data writing operation includes writing the write data into an unwritten storage field in a current physical memory page of the first memory unit, and writing the write data into a storage field corresponding to the write address in the second memory unit. Whether the current physical memory page of the first memory unit is full is determined after the data writing operation is executed. When the current physical memory page of the first memory unit is full, a data arranging operation is executed on the current physical memory page according to a plurality of data in the second memory unit and corresponding to the current physical memory page. When a read command is received, according to a read address in the read command, second data corresponding to the read address in the second memory unit is read.

In an embodiment of the disclosure, the step of comparing the write data with the first data corresponding to the write address in the second memory unit to generate the comparison result and determining whether to execute the data writing operation according to the comparison result includes: determining whether the write data is the same as the first data; not executing the data writing operation when the write data is the same as the first data; and executing the data writing operation when the write data is different from the first data.

In an embodiment of the disclosure, the current physical memory page includes a plurality of storage fields and each of the storage fields is configured to store address information and a data content corresponding thereto, and in the second memory unit, a storage field corresponding to the address information is only configured to store the data content, and the data writing operation further includes: writing the write address and the write data into the unwritten storage field in the current physical memory page; and only writing the write data into the storage field corresponding to the write address and in the second memory unit.

In an embodiment of the disclosure, the step of executing the data arranging operation on the current physical memory page according to the plurality of data in the second memory unit and corresponding to the current physical memory page when the current physical memory page of the first memory unit is full includes: selecting one of the physical memory pages to establish a replacement physical memory page which is different from the current physical memory page; copying at least one valid data of the plurality of data corresponding to the current physical memory page in the second memory unit, to the replacement physical memory page of the first memory unit; and erasing the current physical memory page and setting the replacement physical memory page as the current physical memory page.

In an embodiment of the disclosure, the data access method further includes: setting an erase count field in the current physical memory page, wherein the erase count field is configured to store a number of erase cycles of the memory apparatus; determining whether the current physical memory page is a last physical memory page in an access sequence when the current physical memory page of the first memory unit is full; and accumulating the number of erase cycles when the full current physical memory page is the last physical memory page in the access sequence.

In an embodiment of the disclosure, the data access method further includes: obtaining at least one valid data and at least one storage address corresponding to the at least one valid data in the first memory unit when the memory apparatus is powered on; and copying the valid data to the storage address in the second memory unit.

In an embodiment of the disclosure, the storage fields of the second memory unit is more than that of the current physical memory page of the first memory unit.

The present disclosure further provides a memory apparatus, which includes a first memory unit, a second memory unit, and a controller. The first memory unit includes a plurality of physical memory pages. The second memory unit has a data access speed higher than a data access speed of the first memory unit. The controller is electrically coupled to the first memory unit and the second memory unit. The controller receives write data, and the write data corresponds to a write address. The controller compares the write data with first data corresponding to the write address in the second memory unit to generate a comparison result and determines whether to execute a data writing operation according to the comparison result. The data writing operation includes writing the write data into an unwritten storage field of a current physical memory page of the first memory unit and writing the write data into a storage field corresponding to the write address in the second memory unit. After executing the data writing operation, the controller determines whether the current physical memory page of the first memory unit is full, and when the current physical memory page of the first memory unit is full, the controller executes a data arranging operation on the current physical memory page according to a plurality of data in the second memory unit and corresponding to the current physical memory page. When receiving a read command, according to a read address in the read command, the controller reads second data corresponding to the read address in the second memory unit.

In an embodiment of the disclosure, the controller determines whether the write data is the same as the first data, and the controller does not execute the data writing operation when the write data is the same as the first data, and the controller executes the data writing operation when the write data is different from the first data.

In an embodiment of the disclosure, the current physical memory page includes a plurality of storage fields and each of the storage fields is configured to store address information and a data content corresponding thereto, and the second memory unit has a storage field corresponding to the address information and only configured to store the data content, and the controller further writes the write address and the write data into the unwritten storage field in the current physical memory page and only writes the write data into the storage field corresponding to the write address in the second memory unit.

To make the aforementioned and other features and advantages of the present disclosure more comprehensible, several embodiments accompanied with drawings are described in detail as follows.

BRIEF DESCRIPTION OF THE DRAWINGS

The accompanying drawings are included to provide a further understanding of the present disclosure, and are incorporated in and constitute a part of this specification. The drawings illustrate exemplary embodiments of the present disclosure and, together with the description, serve to explain the principles of the present disclosure.

DESCRIPTION OF THE EMBODIMENTS

In single-chip products, flash memory is commonly used for storing non-volatile data that is frequently accessed. Based on the device characteristics, however, the flash memory has a limited endurance. According to the data access mechanism of the flash memory, when the currently-used physical memory page is full, the flash memory may move valid data from this physical memory page to release the storage space, but such an operation results in undesired increase of the number of times of accessing. If the flash memory writes data only when the data needs to be updated, and the frequency of accessing the flash memory is reduced when the data is moved, the lifetime of the flash memory may be extended effectively. Considering the above, the embodiments of the present disclosure provide a memory apparatus that uses a flash memory (first memory unit) in combination with a static random access memory (SRAM) (second memory unit) and a data access method thereof to simulate an endurance comparable to that of EEPROM without compromising the size and data access speed of the memory apparatus. In order to make the present disclosure more comprehensible, embodiments are described below as examples to demonstrate that the present disclosure can actually be realized.

Figure 1:
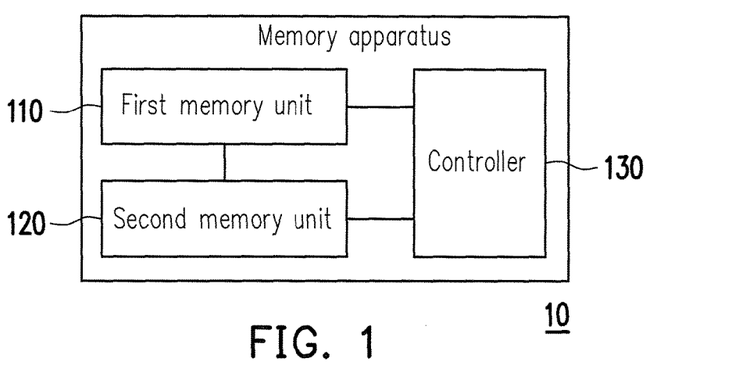
FIG. 1 is a block diagram of a memory apparatus according to an embodiment of the present disclosure.

FIG. 1 is a block diagram of a memory apparatus according to an embodiment of the present disclosure. Referring to FIG. 1, a memory apparatus 10 includes a first memory unit 110, a second memory unit 120, and a controller 130. The memory apparatus 10 may serve as a storage space for storing a variety of user data or system data. In an embodiment, the memory apparatus 10 may be an electronic device which includes a storage device (corresponding to the first memory unit 110 and the second memory unit 120) and a host (corresponding to the controller 130).

Moreover, in other embodiments, the memory apparatus 10 may be a storage device independent of the host. The memory apparatus 10 may be disposed in the host (not shown) and electrically connected with the host. Alternatively, the memory apparatus 10 may be electrically connected with the host externally. For example, the memory apparatus 10 may be electrically connected with the host via various buses, such as a universal serial bus (USB). Nevertheless, the invention is not limited thereto.

The first memory unit 110 is a non-volatile memory, such as a flash memory, which includes a plurality of physical blocks for storing data written by the host, for example. Each of the physical blocks includes a plurality of physical memory pages, wherein one physical memory page may be a minimum unit for erasing. That is, the data in one physical memory page may be erased together in a data erasing operation.

The second memory unit 120 is a static random access memory, for example. Here, a data access speed of the second memory unit 120 may be higher than a data access speed of the first memory unit 110.

The controller 130 is configured to execute a plurality of logic gates or control commands implemented in a hardware form or a firmware form, so as to execute a data access method provided by an embodiment of the present disclosure and thereby perform operations, such as data writing, reading, and erasing, in the first memory unit 110 and the second memory unit 120. In a case where the memory apparatus 10 is the electronic device, the controller 130 may be the host. In a case where the memory apparatus 10 is the storage device, the controller 130 may be a memory controller, which is implemented by a system on chip (SOC), for example.

Here, the controller 130 selects a plurality of physical memory pages that are available for writing data (referred to as available physical memory pages hereinafter) from the physical memory pages of the first memory unit 110 and selects one of the available physical memory pages as a current physical memory page. The physical memory pages have similar configurations. Here, the current physical memory page is described in detail as an example. Specifically, the current physical memory page may include a plurality of storage fields, and each storage field may include two subfields respectively for storing address information and a data content corresponding to the address information.

Moreover, each storage field is capable of storing 2-byte data, for example. Based on whether data has been written therein, the storage fields may be divided into storage regions in which data has been written (referred to as written regions hereinafter) and storage regions in which no data has been written (referred to as unwritten regions hereinafter). When new data is to be written into the first memory unit 110, the controller 130 may write the data into the storage field of the unwritten region.

On the other hand, the second memory unit 120 may include a plurality of storage fields, and each of the storage fields is only used for storing the data content. Each of the storage fields is capable of storing 1-byte data, for example. Here, the number of the storage fields of the second memory unit 120 may be greater than the number of the storage fields of the current physical memory page of the first memory unit 110. The controller 130 may copy the valid data that has been stored in the first memory unit 110 (the latest data content corresponding to the address information stored in the first memory unit 110, for example) to the second memory unit 120 in an initialization stage (when the memory apparatus 10 is powered on and the power supply is maintained, for example). Accordingly, since the data stored in the second memory unit 120 is the same as the valid data stored in the first memory unit 110, in this embodiment, when an external device is to access data stored in the first memory unit 110, the second memory unit 120 may be accessed instead of the first memory unit 110, so as to reduce the number of times of accessing the first memory unit 110.

Moreover, the controller 130 may maintain a logical to physical address mapping table to record a mapping relationship between a logical address and a physical address of the first memory unit 110. When the host is to access the data corresponding to a certain logical address, the controller 130 may access the data in the corresponding physical address in the first memory unit 110 according to the logical to physical address mapping table. Such a technique should be commonly known to those skilled in the art and thus is not described in detail here.

Figure 2:
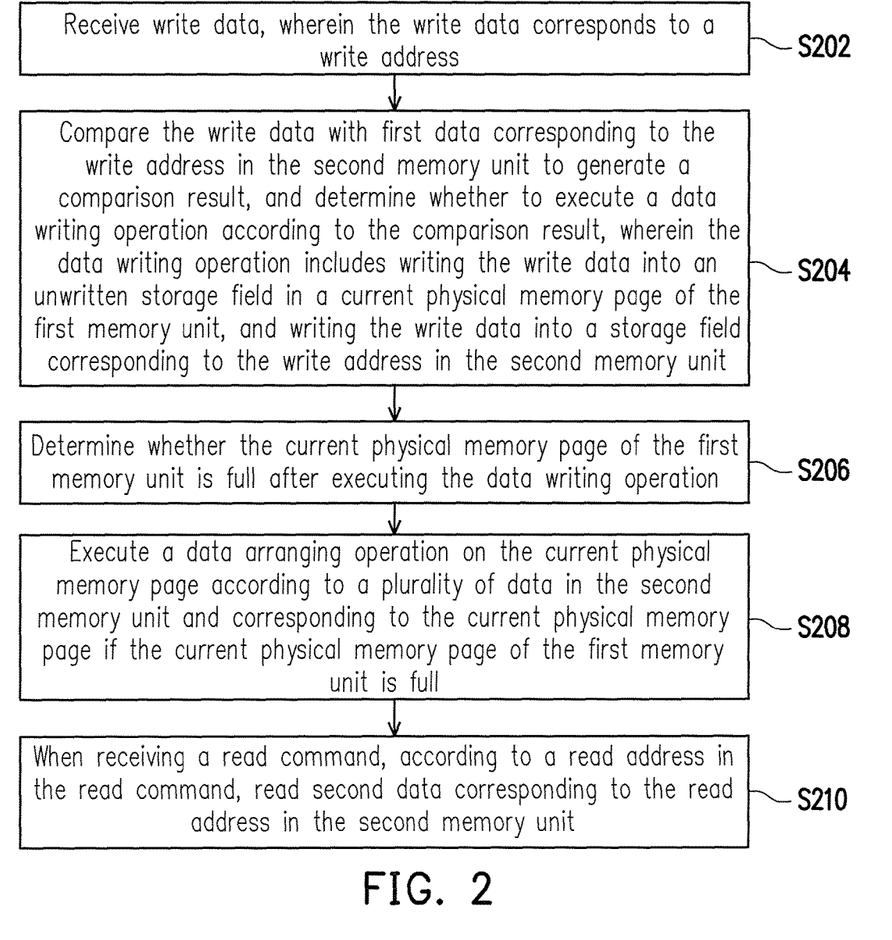
FIG. 2 is a flowchart showing a data access method of a memory apparatus according to an embodiment of the present disclosure.

FIG. 2 is a flowchart showing a data access method of a memory apparatus according to an embodiment of the present disclosure, which is adapted for the memory apparatus 10 of FIG. 1. Steps of the method are described in detail hereinafter with reference to the components shown in FIG. 1.

First, in Step S202, the controller 130 receives write data, and the write data corresponds to a write address. In Step S204, the controller 130 compares the write data with first data corresponding to the write address in the second memory unit 120, so as to generate a comparison result, and determines whether to execute a data writing operation according to the comparison result. The data writing operation includes writing the write data into an unwritten storage field in the current physical memory page of the first memory unit 110, and writing the write data into a storage field corresponding to the write address in the second memory unit 120.

Specifically, the write address is an address for the controller 130 to access the second memory unit 120, for example. As described above, because the data stored in the second memory unit 120 and the valid data stored in the first memory unit 110 are the same, when the write data is received, the controller 130 first accesses the first data in the second memory unit 120 and corresponding to the write address, and compares the write data with the first data, so as to determine whether the data in the first memory unit 110 needs to be changed. More specifically, the controller 130 accesses the first data in the second memory unit 120 for comparison with the write data to determine whether the write data is the same as the first data. If the write data is the same as the first data, it indicates that the data in the first memory unit 110 and the second memory unit 120 does not need to be changed. Thus, the controller 130 does not execute the data writing operation. If the write data and the first data are different, it indicates that the data in the first memory unit 110 and the second memory unit 120 needs to be updated. Thus, the controller 130 executes the data writing operation to write the write data into the first memory unit 110 and the second memory unit 120 both.

Accordingly, in this embodiment, the second memory unit 120 is accessed for determining whether the data in the first memory unit 110 needs to be updated, and the data writing operation is executed on the first memory unit 110 only when it is determined that the data needs to be updated.

Next, in Step S206, after executing the data writing operation, the controller 130 determines whether the current physical memory page of the first memory unit 110 is full. In Step S208, when the current physical memory page of the first memory unit 110 is full, the controller 130 executes a data arranging operation on the current physical memory page according to a plurality of data in the second memory unit 120 and corresponding to the current physical memory page.

Specifically, when the current physical memory page is full, the controller 130 of this embodiment may use the data stored in the second memory unit 120 to move the valid data in the current physical memory page to another available physical memory page (referred to as a replacement physical memory page hereinafter) and release the storage space of the current physical memory page, so as to complete arrangement of the data of the current physical memory page. In an embodiment, the controller 130 may select one of the physical memory pages to establish the replacement physical memory page and copy at least one valid data among the data corresponding to the current physical memory page in the second memory unit 120 to the replacement physical memory page of the first memory unit 110, and erase the current physical memory page and set the replacement physical memory page as the current physical memory page.

The physical memory pages available to be used by the controller 130 are arranged in a sequence (referred to as an access sequence hereinafter) according to the corresponding physical addresses, for example. Therefore, the controller 130 may select the physical memory page following the current physical memory page in the access sequence as the replacement physical memory page. The sequence may also be determined by a number of times that each physical memory page is erased, for example. For example, the controller 130 may select one physical memory page whose number of times of erasing is smaller from the physical memory pages to serve as the replacement physical memory page, so as to achieve wear leveling between the physical memory pages. The present disclosure is not intended to limit how the replacement physical memory page is selected.

Accordingly, in this embodiment, the second memory unit 120 is accessed to obtain the valid data in the current physical memory page of the first memory unit 110, so as to eliminate the need to perform an additional accessing operation of searching the valid data in the current physical memory page for copying the valid data.

Referring to FIG. 2 again, in Step S210, when a read command is received, according to a read logical address in the read command, the controller 130 reads second data corresponding to the read logical address and stored in the second memory unit 120. Therefore, in this embodiment, the controller 130 may directly read data from the second memory unit 120 and is not required to search for the last updated data corresponding to the read logical address in the physical memory page of the first memory unit 110. Hence, the data read speed is improved efficiently. The read command is sent by the host, for example.

Accordingly, in some embodiments of the present disclosure, as compared with the conventional technology, when the controller is to access data stored in the first memory unit 110, the data stored in the second memory unit 120 is accessed instead. As a result, the frequency of accessing the first memory unit 110 is efficiently reduced, so that the lifetime of the first memory unit 110 is extended, which is equivalent to that the data retention of the memory apparatus 10 is improved. In addition, because the data access speed of the second memory unit 120 is higher than the data access speed of the first memory unit 110, the data read speed of the memory apparatus 10 is improved.

Figure 3:
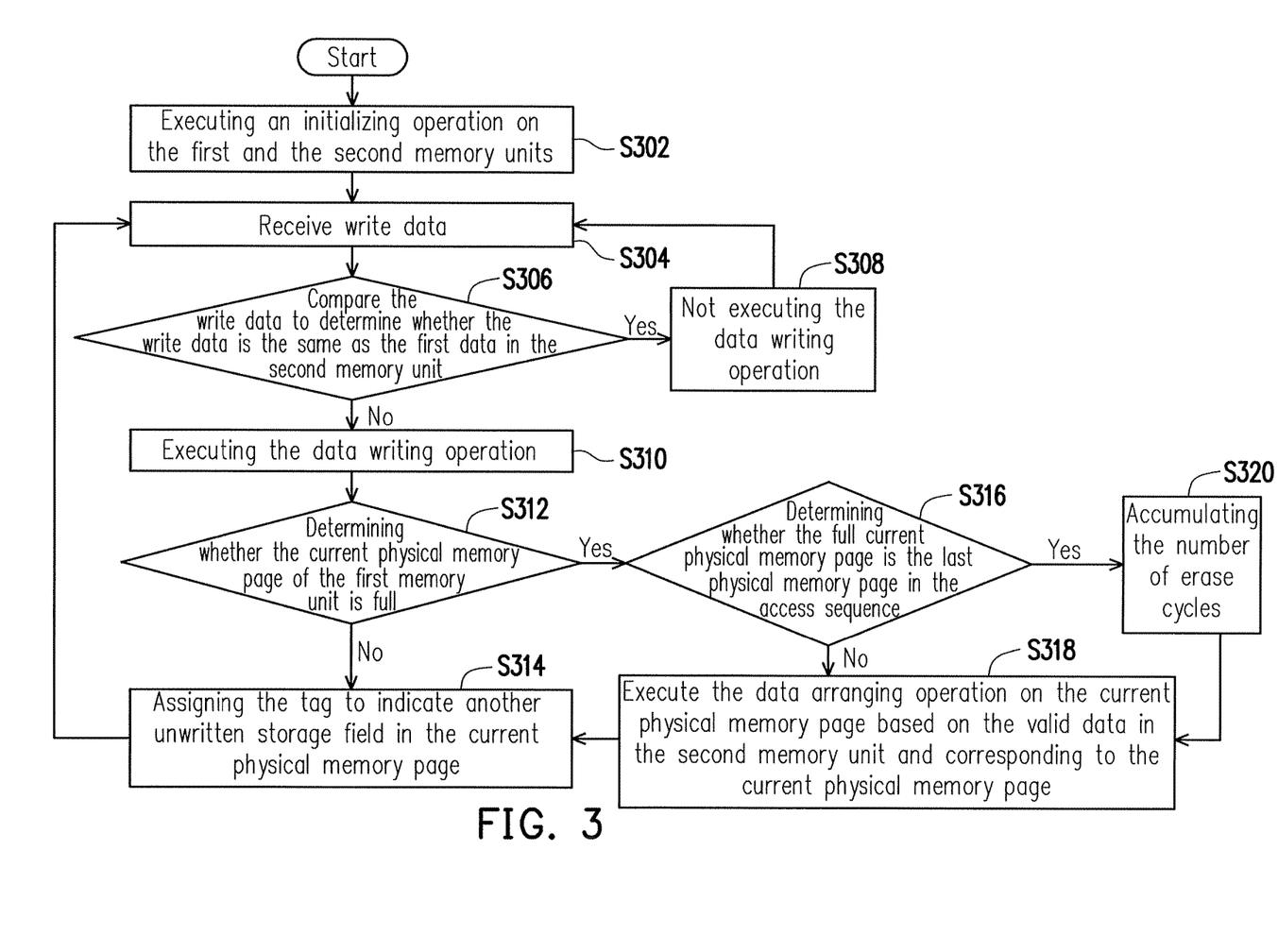
FIG. 3 is a flowchart showing a data access method of a memory apparatus according to an embodiment of the present disclosure.

An embodiment of a data writing process is provided hereinafter. Referring to FIG. 3, FIG. 3 is a flowchart showing a data access method according to an embodiment of the present disclosure, which is adapted for the memory apparatus 10 of FIG. 1.

First, in Step S302, the controller 130 executes an initializing operation on the first and the second memory units 110 and 120. In an initialization stage, the controller 130 determines available physical memory pages in the first memory unit 110 and sets the physical memory page that stores the valid data of the first memory unit 110 among the physical memory pages as the current physical memory page. Then, the controller 130 copies the valid data to the second memory unit 120.

Specifically, in an embodiment, the controller 130 executes the initializing operation when the memory apparatus 10 is powered on, for example. After the available physical memory pages and the current physical memory page are determined, the controller 130 searches the storage fields in the current physical memory page to obtain at least one valid data stored in the first memory unit 110 and at least one storage address corresponding to the valid data, and copies the valid data to the storage address in the second memory unit 120. In other words, in some embodiments of the present disclosure, as compared with the conventional technology, the address for accessing the second memory unit 120 is stored in the storage field of the first memory unit 110, which is equivalent to establishing a corresponding relationship between the first memory unit 110 and the second memory unit 120. Based on the above, the storage fields in the second memory unit 120 may store the data content only. Thus, the size of the second memory unit 120 may be maintained. Moreover, with the second memory unit 120, the read speed is improved.

Furthermore, the controller 130 may assign a tag to the current physical memory page to indicate a storage field in the unwritten region of the current physical memory page. When the controller 130 determines to execute the data writing operation, the controller 130 writes the received write data and the corresponding write logical address into the storage field indicated by the tag.

In Step S304, the controller 130 receives the write data. In Step S306, the controller 130 determines whether the write data is the same as the first data corresponding to the write address in the second memory unit 120. When the write data is the same as the first data, the controller 130 moves on to Step S308 and does not execute the data writing operation, and returns to Step S304 to receive the next write data. When the write data is different from the first data, the controller 130 moves on to Step S310 and executes the data writing operation. Step S304 of this embodiment is similar to Step S202 of the embodiment of FIG. 2, and Steps S306, S308, and S310 of this embodiment are similar to Step S204 of the embodiment of FIG. 2. Thus, the same or similar descriptions are not repeated hereinafter. It should be noted that, in this embodiment, the data writing operation executed by the controller 130 may further include writing the write data and the write address into the same storage field that is unwritten in the current physical memory page. Thereby, the corresponding relationship between the first memory unit 110 and the second memory unit 120 may be updated simultaneously according to the write address written into the first memory unit 110.

After executing the data writing operation, the controller 130 moves on to Step S312 and determines whether the current physical memory page of the first memory unit 110 is full. In this embodiment, the controller 130 may determine whether the current physical memory page is full based on whether the storage field indicated by the tag is found. If the current physical memory page of the first memory unit 110 is not full, the controller 130 moves on to Step S314 and assigns the tag to indicate another unwritten storage field in the current physical memory page. Then, the controller 130 returns to Step S304.

As compared with the conventional technology, in some embodiments of the present disclosure, the controller 130 may further set an erase count field in the current physical memory page for storing a number of erase cycles of the memory apparatus 10. When the available physical memory pages are all erased once, the controller 130 may add 1 to the number of erase cycles. It should be noted that, among the physical memory pages, only the data stored in the erase count field of the current physical memory page is not a preset value (here, the preset value is a value stored after erasing, e.g. 0xFFFF, for example). Therefore, in these embodiments, the current physical memory page may be identified by determining whether the data in the erase count field is the preset value, and the current number of erase cycles of the memory apparatus 10 may be further determined. A number of bits of data in the erase count field is 2 bytes, for example.

Thus, when the current physical memory page of the first memory unit 110 is full, in Step S316, the controller 130 determines whether the full current physical memory page is the last physical memory page in the access sequence. If the controller 130 determines that the full current physical memory page is not the last corresponding physical memory page in the access sequence, in Step S318, the controller 130 executes the data arranging operation on the current physical memory page based on the valid data in the second memory unit 120 and corresponding to the current physical memory page. Here, Step S318 is similar to Step S208 of the embodiment of FIG. 2. Thus, details are not repeated hereinafter. Thereafter, Step S314 is performed.

On the other hand, when the full current physical memory page is the last corresponding physical memory page in the access sequence, the controller 130 moves on to Step S320 and accumulates the number of erase cycles. Then, Step S318 is performed to execute the data arranging operation on the current physical memory page, and Step S314 is performed.

It should be noted that, in some embodiments, the data retention of the memory apparatus 10 may be obtained by the following Equation (1), for example. R is an average retention of each of the data, SP is the number of bits of the physical memory pages of the first memory unit 110, SC is the number of bits of the erase count field, SF is the number of bits of one storage field of the first memory unit 110, ND is the number of the storage fields that have been written with data, NP is the number of available physical memory pages, and NE is a reliable endurance of the first memory unit 110.

$$R = \frac{SP - SC - SF \times ND}{SF \times ND} \times NP \times NE \qquad (1)$$

For example, in a case where the number of bits of the physical memory pages of the first memory unit 110 (SP) is 512 bytes, the number of bits of the erase count field (SC) is 2 bytes, the number of bits of one storage field of the first memory unit 110 (SF) is 2 bytes, the number of the storage fields that have been written with data (ND) is 8, the number of the available physical memory pages (NP) is 2, and the reliable endurance of the first memory unit 110 (NE) is 20,000 times, the average retention of each of the data of the memory apparatus 10 reaches 2,470,000 times. Accordingly, the data retention up to one million times is achieved effectively.

FIG. 4A to FIG. 4D respectively illustrate examples according to an embodiment of the present disclosure, wherein a first memory unit 410 and a second memory unit 420 are an embodiment of the first memory unit 110 and the second embodiment unit 120 of the embodiment described above.

Figure 4A:
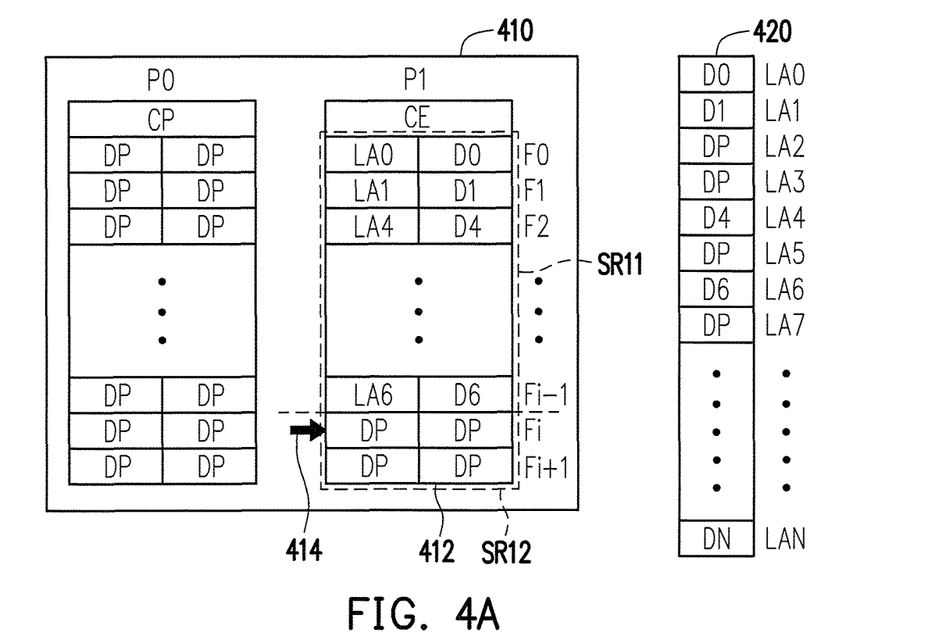
FIG. 4A to FIG. 4D respectively illustrate examples according to an embodiment of the present disclosure.

First, FIG. 4A is a schematic diagram of the first memory unit 410 and the second memory unit 420 when the initializing operation is completed. In this example, physical memory pages P0 and P1 are selected as available physical memory pages and are accessed sequentially. The physical memory page P1 is set as a current physical memory page 412.

A configuration of the physical memory page P1 is described first. As shown in FIG. 4A, the physical memory page P1 includes storage fields F0 to Fi+1, and each storage field includes two subfields respectively for storing the address information and the data content corresponding to the address information. For example, the storage field F0 stores an address LA0 and data D0, and the storage field F1 stores an address LA1 and data D1. Data DP is a data preset value and represents that the corresponding storage field is unwritten or has been erased. Thus, in the physical memory page P1, the storage fields F0 to Fi−1 may be a written region SR11, and the storage fields Fi and Fi+1 may be an unwritten region SR12. In addition, the physical memory page P1 further includes an erase count field that stores a number of erase cycles CE of the memory apparatus. Further, a tag 414 is assigned to indicate the storage field Fi in the unwritten region SR12.

In this example, the physical memory page P0 is unwritten (or has been erased). Thus, the data stored in each storage field is the data DP. Moreover, a value stored in the erase count field is the preset value CP of the number of erase cycles.

On the other hand, the second memory unit 420 may store data in the form of an array, which includes N storage fields (N may be greater than i+1), to provide sufficient storage fields for storing the valid data in the physical memory pages P0 and P1. In the second memory unit 420, the data preset value is the data DP as well. After the initializing operation is completed, the data in the first memory unit 410 is copied to the second memory unit 420 according to the address information stored in the same storage field. For example, the data D0 in the physical memory page P1 is copied to the address LA0 in the second memory unit 420, the data D1 in the physical memory page P1 is copied to the address LA1 in the second memory unit 420, and so on. If the first memory unit 410 does not store the data content corresponding to a specific address (e.g. an address LA3), in the second memory unit 420, the data content stored in the specific address (e.g. the address LA3) is the data DP.

Figure 4B:
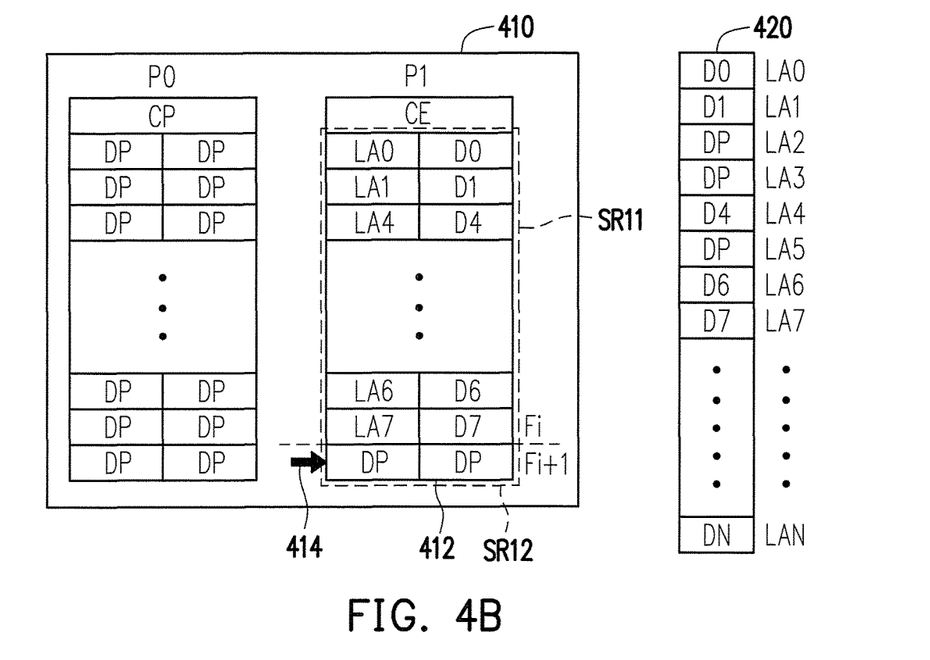

Then, when write data D7 and a corresponding write address LA7 are received, since the write data D7 is different from the data DP corresponding to the write address LA7 in the second memory unit 420, it means that the data in the memory apparatus 10 needs to be changed. Thus, the write address LA7 and the write data D7 are written into the storage field Fi of the physical memory page P1, and the write data D7 is written into the address LA7 of the second memory unit 420. Further, the tag 414 is adjusted to indicate the storage field Fi+1 in the unwritten region SR12. FIG. 4B is a schematic diagram when the above operation has been completed.

Referring to FIG. 4B, if write data D4 and a corresponding write address LA4 are received then, since the write data D4 is the same as the data D4 corresponding to the write address LA4 in the second memory unit 420, it means that the data in the memory apparatus 10 does not need to be changed. Thus, the data writing operation is not executed.

Figure 4C:
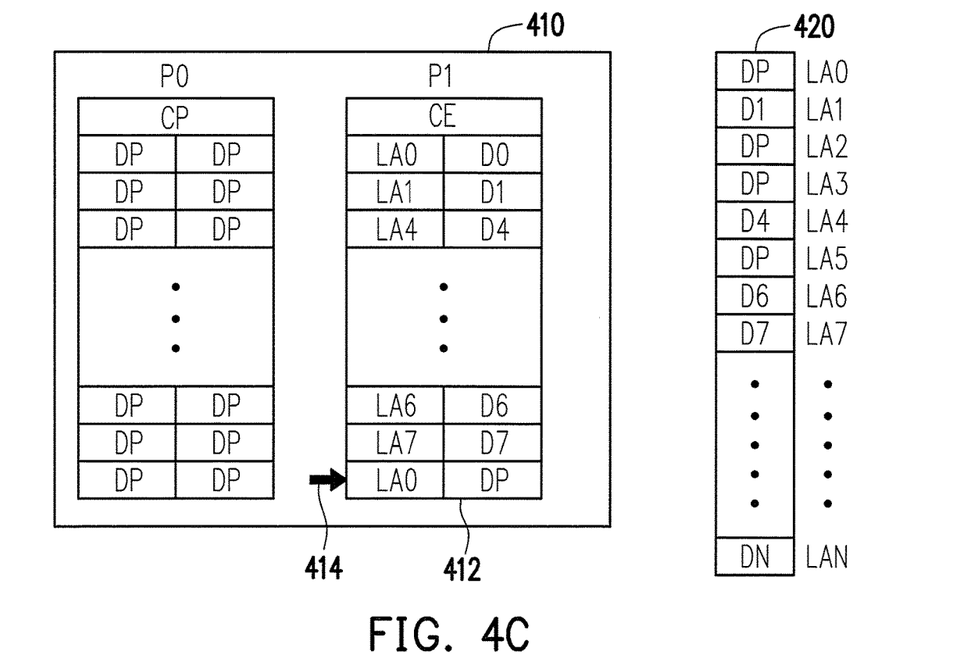

Then, when the write data DP and the corresponding write address LA0 are received, since the write data DP is different from the data D0 corresponding to the write address LA0 in the second memory unit 420, the write address LA0 and the write data DP are written into the storage field Fi+1 of the physical memory page P1, and the write data DP is written into the address LA0 of the second memory unit 420, as shown in FIG. 4C.

Figure 4D:
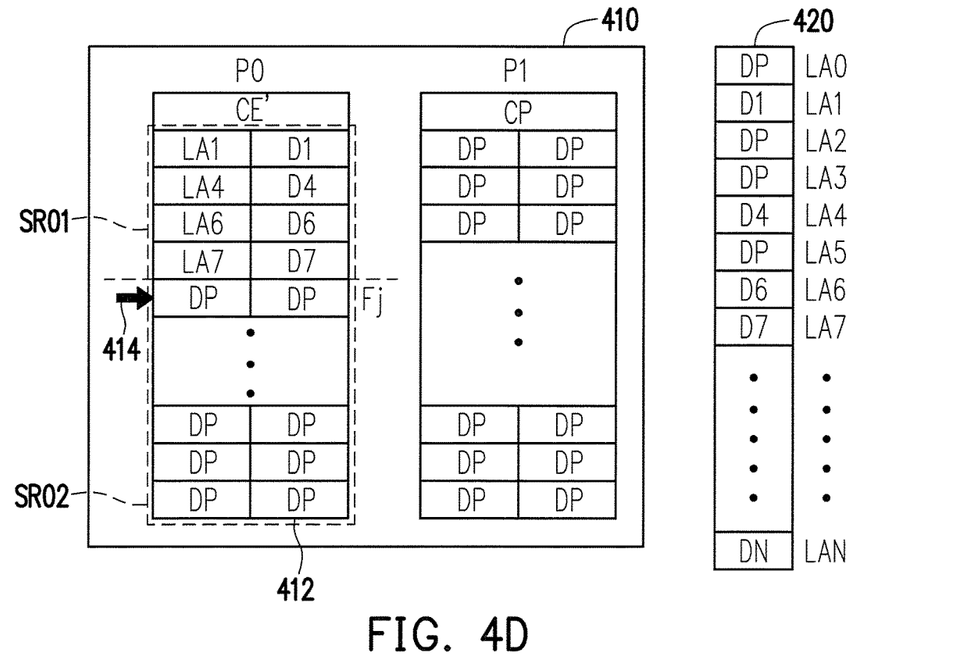

At the moment, the physical memory page P1 is full, and the physical memory page P1 is the last physical memory page in the access sequence. Therefore, the controller 130 accesses the valid data (e.g. the data D1, D4, D6, and D7 respectively corresponding to the addresses LA1, LA4, LA6, and LA7) in the second memory unit 420 and copies the valid data to the physical memory page P0. In addition,1 is accumulated to the number of erase cycles CE, which is then written into the erase count field of the physical memory page P0 (a number of erase cycles after the accumulation is CE' in this embodiment). Thereafter, the physical memory page P1 is erased and the physical memory page P0 is set as the current physical memory page 412. At the moment, the physical memory page P0 may include a written region SR01 and an unwritten region SR02, and the tag 414 indicates a storage field Fj in the unwritten region SR02. As to the erased physical memory page P1, each storage field is erased to store the data preset value (the data DP), and the erase count field is also erased to store the preset value CP of the number of erase cycles. FIG. 4D is a schematic diagram when the above process has been completed.

To conclude, the first memory unit (flash memory) is used in combination with the second memory unit (static random access memory) in the embodiments of the present disclosure. Upon receipt of the write data, the write data is compared with the data in the second memory unit first and accordingly the data writing operation is executed only when it is determined that the data needs to be changed. In addition, when the current physical memory page of the first memory unit is full, the data in the current physical memory page may be arranged according to the data in the second memory unit. Accordingly, the number of times of accessing the first memory unit is reduced effectively and the data retention is improved accordingly. Furthermore, the read function is provided by using the second memory unit, which also enhances the data read speed of the memory apparatus.

In some embodiments, using the second memory unit to equivalently improve the endurance may slightly increase the size of the memory apparatus. However, since the storage fields of the second memory unit are only for storing the data content and are not required to store the corresponding address information, the overall endurance, size, and read speed of the memory apparatus may be balanced.

It is worth mentioning that, in some other embodiments, the first memory unit and the second memory unit exchange data only when the memory apparatus is powered on or off (power supply to the memory apparatus is stopped) and the currently used memory pages of the first memory unit are full. In other cases, the data access function may be provided by the second memory unit only. Since the data stored in the second memory unit will disappear when the power supply is stopped, when the memory apparatus is powered off, the controller may adaptively copy the data in the second memory unit to the first memory unit.

Based on the above, in some embodiments, the present disclosure achieves better data retention and high read speed in comparison with the conventional technology that uses the static random access memory as a buffer memory. The reason is that the buffer memory is usually used for the host to temporarily store data, which is then copied from the buffer memory to the storage device. Thus, the host does not access the data in the buffer memory after temporarily storing the data in the buffer memory. Moreover, under the conventional architecture, the buffer memory cannot increase the endurance of the storage device.

In terms of the conventional technology that uses the static random access memory as a cache memory, generally the cache memory is only used for improving the data access speed and cannot increase the endurance of the storage device. Thus, in some embodiments, the present disclosure achieves better data reliability than the conventional technology.

Additionally, in the embodiments of the present disclosure, the erase count field is set to efficiently indicate the current physical memory page that is currently used in the first memory unit, and the number of erase cycles stored in the erase count field may provide information related to the number of times of erase cycles that the memory apparatus has executed.

It will be apparent to those skilled in the art that various modifications and variations can be made to the disclosed embodiments without departing from the scope or spirit of the present disclosure. In view of the foregoing, it is intended that the present disclosure covers modifications and variations of this disclosure provided that they fall within the scope of the following claims and their equivalents.

What is claimed is:

1. A data access method of a memory apparatus, wherein the memory apparatus comprises a first memory unit and a second memory unit, the first memory unit comprises a plurality of physical memory pages, and a data access speed of the second memory unit is higher than a data access speed of the first memory unit, the data access method comprising:

receiving write data which corresponds to a write address of the second memory unit;

comparing the write data with a first data stored in the second memory unit and corresponding to the write address to generate a comparison result, and determining whether to execute a data writing operation according to the comparison result, wherein the data writing operation comprises writing the write data into an unwritten storage field in a current physical memory page of the first memory unit, and writing the write data into a storage field of the second memory unit corresponding to the write address;

determining whether the current physical memory page of the first memory unit is full after executing the data writing operation;

executing a data arranging operation on the current physical memory page according to a plurality of data in the second memory unit and corresponding to the current physical memory page when the current physical memory page of the first memory unit is full; and when receiving a read command, according to a read address in the read command, reading a second data corresponding to the read address in the second memory unit, wherein the step of executing the data arranging operation on the current physical memory page according to the plurality of data in the second memory unit and corresponding to the current physical memory page when the current physical memory page of the first memory unit is full comprises:

selecting one of the physical memory pages to establish a replacement physical memory page, wherein the replacement physical memory page is different from the current physical memory page;

copying at least one valid data of the plurality of data corresponding to the current physical memory page in the second memory unit to the replacement physical memory page of the first memory unit; and erasing the current physical memory page and setting the replacement physical memory page as the current physical memory page.

2. The data access method according to claim 1, wherein the step of comparing the write data with the first data stored in the second memory unit and corresponding to the write address to generate the comparison result and determining whether to execute the data writing operation according to the comparison result comprises:

determining whether the write data is the same as the first data;

not executing the data writing operation when the write data is the same as the first data; and executing the data writing operation when the write data is different from the first data.

3. The data access method according to claim 1, wherein the current physical memory page comprises a plurality of storage fields and each of the storage fields is configured to store an address information and a data content corresponding to the address information, and in the second memory unit, a storage field corresponding to the address information is only configured to store the data content, and the data writing operation further comprises:

writing the write address and the write data into the unwritten storage field in the current physical memory page; and only writing the write data into the storage field of the second memory unit corresponding to the write address.

4. The data access method according to claim 1, further comprising:
- setting an erase count field in the current physical memory page, wherein the erase count field is configured to store a number of erase cycles of the memory apparatus;
- determining whether the current physical memory page is a last physical memory page in an access sequence when the current physical memory page of the first memory unit is full; and
- accumulating the number of erase cycles when the full current physical memory page is the last physical memory page in the access sequence.

5. The data access method according to claim 1, further comprising:
- obtaining at least one valid data and at least one storage address corresponding to the at least one valid data in the first memory unit when the memory apparatus is powered on; and
- copying the at least one valid data to the at least one storage address in the second memory unit.

6. The data access method according to claim 1, wherein a number of the storage fields of the second memory unit is greater than a number of the storage fields of the current physical memory page of the first memory unit.

* * * * *